United States Patent
Horiba

[19]
[11] Patent Number: 5,846,878
[45] Date of Patent: Dec. 8, 1998

[54] METHOD OF MANUFACTURING A WIRING LAYER IN A SEMICONDUCTOR DEVICE

[75] Inventor: Shinichi Horiba, Tokyo, Japan

[73] Assignee: NEC Corporation, Tokyo, Japan

[21] Appl. No.: 808,529

[22] Filed: Feb. 28, 1997

[51] Int. Cl.[6] .............................................. H01L 21/4763
[52] U.S. Cl. ............................................ 438/636; 438/952
[58] Field of Search ........................... 437/19, 173, 907, 437/908, 40 GS, 41 GS; 438/636, 952

[56] References Cited

U.S. PATENT DOCUMENTS

| | | | |
|---|---|---|---|
| 5,066,615 | 11/1991 | Brady et al. | 437/229 |
| 5,302,538 | 4/1994 | Ishikawa et al. | 437/40 |
| 5,488,246 | 1/1996 | Hayashide et al. | 257/336 |
| 5,600,165 | 2/1997 | Tsukamoto et al. | 257/323 |
| 5,604,157 | 2/1997 | Dai et al. | 437/200 |
| 5,626,967 | 5/1997 | Pramanick et al. | 428/446 |
| 5,656,128 | 8/1997 | Hashimoto et al. | 438/952 |

*Primary Examiner*—Brian Dutton
*Attorney, Agent, or Firm*—Foley & Lardner

[57] ABSTRACT

In a method of building up wiring with a protective insulator film as a mask, a precise and elaborate wiring pattern is formed. The method comprises a process of making up a conductive material film on the surface of a semiconductor substrate, a process of depositing a inorganic insulator film consisting of a semiconductor oxide film and a semiconductor nitride film in layers on the conductive material film, a process of making up an antireflection film for an irradiation light for sensitizing used in photo lithography which patterns photosensitivity resist film, a process of making up the photosensitivity resist film on the antireflection film to pattern in a predetermined shape, and a process of applying dry etching to the conductive material film and the antireflection film with the inorganic insulator film as a mask.

2 Claims, 6 Drawing Sheets

METHOD OF MANUFACTURING A WIRING LAYER IN A SEMICONDUCTOR DEVICE

BACKGROUND OF THE INVENTION

The present invention relates to a method of manufacturing a semiconductor apparatus, more particularly to a method of precisely forming a elaborate pattern of wiring.

DESCRIPTION OF THE RELATED ART

The tendency of the elaborateness and high density of a semiconductor device is still vigorously growing, and now, ultra high integrated semiconductors such as a memory device and a logic device and the like designed on the basis of approximately 0.2 $\mu$m in dimensions are made on an experimental basis. In this way, the dimensions of the semiconductor device is increasing with the high integration of the semiconductor device. Moreover, it is important to reduce dimensions of a gate electrode, a diffused layer and wiring in width and of the film of materials consisting of the semiconductor device in thickness.

Thus, the dimensional variation of a component pattern of the elaborated semiconductor, in particular, the variation of the gate electrode width, has the greatest influence on a characteristic of an insulated gate field effect transistor (hereafter MOS transistor). Further, due to the reduction of dimensions between the electrode wiring and the increase of aspect ratio of the wiring pattern, it becomes difficult to ensure the reliability of the semiconductor device. As a result, it is essential for the manufacturing of the semiconductor device to reduce the dimensional variation.

In this way, it is most important to control the dimensions of the component patterns of the semiconductor device together with its elaborateness.

A method of forming precise wiring will be described referring to gate electrode wiring as an example in accordance with FIG. 1A, 1B. FIG. 1A, 1B show a plan view and a cross section diagram of a gate electrode pattern each. FIG. 1B is a cross-sectional view along line 1—1 in FIG. 1A.

A field oxide film 102 is selectively made up in a predetermined area on a silicon substrate 101 as shown in FIGS. 1A, 1B, and a gate-insulator film 104 is made up in an active region 103 surrounded by the field oxide film 102. Subsequently, polycide wiring 105 acting as the gate electrode of the MOS transistor is formed, and a protective insulator film 106 adhering to the polycide wiring 105 is piled up.

Here, the protective insulator film 106 is made up by etching for a protective insulator film layer with using a photo resist mask formed by means of photo lithography as a mask for dry etching. In the next step, the photo resist mask is removed to form the polycide wiring 105 in patterns by way of the dry etching in which the protective insulator film 106 is used as a mask. Consequently, gate electrode patterns 105' shown in FIG. 1A is formed. However, the furrowings of the wiring patterns 107 as shown in FIG. 1A are produced around a boundary between the field oxide film 102 and the active area 103.

Thus, in the precise patterning of the gate electrode wiring and the other wirings, the insulator film is formed in the upside of the wiring to be patterned, the dry etching is applied for wiring materials with using the patterned insulator film as a mask, and finally the wiring is built up.

Therefore, the means of employing the insulator film as a mask for dry etching is recognized with increasing importance as an effective means for coping with (1) a growing difficulty in dry etching manipulation with the increase of each aspect ratio of the wiring pattern and the photo resist mask, (2) the increasing use of the insulator film that has the same pattern as wiring in the formation of a self-contact matching type contact.

In a method of manufacturing the wiring described above, a protective insulator film is made up on the surface of a polycide wiring consisting of the gate electrode of the MOS transistor. Further, the polycide wiring is formed by way of dry etching with the protective insulating film as a mask. Such a method that employs the protective insulator film as a mask for dry etching is applied for the formation of aluminum wiring and the other wirings.

However, the method of forming the wiring of the gate electrode with the protective insulator film as a mask causes the generation of the furrowings 107 of a completed wiring pattern as described in FIG. 1A. This is due to the increase of a reflected light from the surface of wiring in an exposure process of photo lithography as a result of the formation of a transparent protective insulator film. The details will be mentioned later. The furrowings of the wiring pattern of the gate electrode increase the variation of an electrical specificity of the MOS transistor. Especially, the elaborateness of the MOS transistor makes this tendency significant.

Likewise, in the wiring of the aluminum and the others, the increase of the amount of a reflected light by the protective insulator film gives rise to the furrowings of the wiring pattern in a difference part of foundation, which result in a significant lowering of reliability and recovery of the semiconductor apparatus.

SUMMARY OF THE INVENTION

In view of the foregoing, one of the objects of the present invention to solve the above problems and to provide a method of forming an elaborate and precise wiring pattern in a method of forming wiring with such a protective insulator film as a mask.

A method of forming a wiring pattern according to the present invention comprises a process of forming a conductive material film on the surface of a semiconductor substrate, a process of depositing a inorganic insulator film, which consists of a semiconductor oxide film and a semiconductor nitride film, on the conductive material film, a process of forming an antireflection film for an irradiation light for a sensitizing on the inorganic insulator film used in photo lithography which patterns a photosensitivity resist film, and a process of forming the photosensitivity resist film on the antireflection film to pattern in a predetermined shape.

Moreover, a method of forming a wiring pattern of the present invention includes a process of applying dry etching to the antireflection film and the inorganic insulator film with the patterned photosensitivity resist film as a mask, a process of removing the patterned photosensitivity resist film, and a process of applying dry etching to the conductive material film and the antireflection film with the inorganic insulator film as a mask.

Here, the antireflection film is made up of an amorphous silicon thin film or a titanium nitride thin film.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Next, with reference to the accompanying drawings, description will be given of the details of the present invention.

Figure 1A:
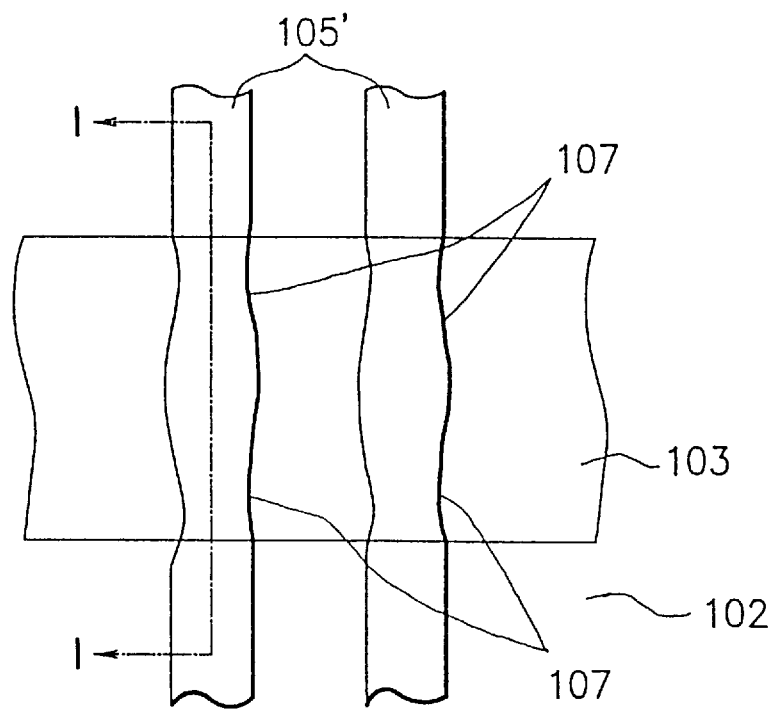
FIGS. 1A, 1B are schematic diagrams of wiring showing conventional arts.
Figure 1B:
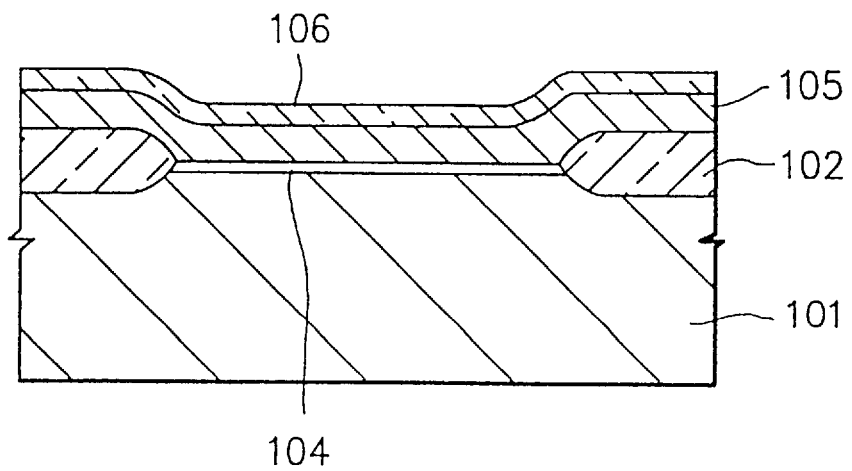
Figure 2A:
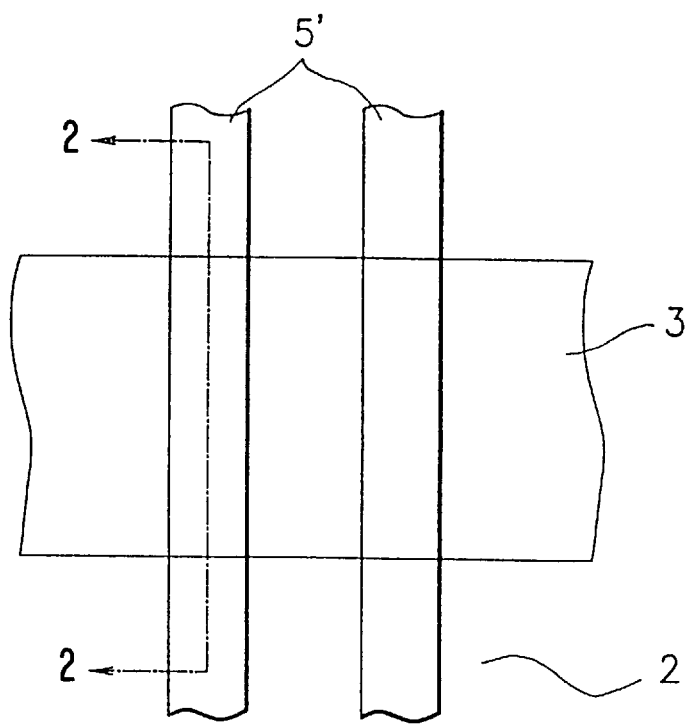
FIGS. 2A, 2B are schematic diagrams of wiring showing a first embodiment of the present invention.
Figure 2B:
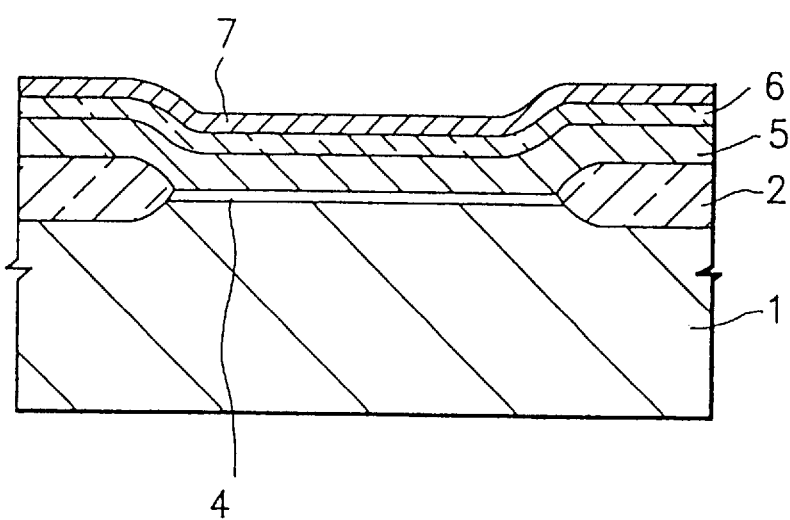

FIGS. 2A, 2B are schematic diagrams showing a first embodiment of the present invention, especially, are a plan view and its cross section diagram of a gate electrode pattern corresponding to FIGS. 1A and 1B. Here, a cutting plane indicated by 2—2 in the plan view of FIG. 2A is shown as the cross section diagram in FIG. 2B.

As shown in FIGS. 2A, 2B, a field oxide film 2 is selectively made up in a predetermined area on a silicon substrate 1. The field oxide film 2 is made up by LOCOS (Local Oxidation of Silicon) method, and its film thickness is set to approximately 400 nm. Next, a gate insulator film 4 is made up in an active region 3 surrounded by the field oxide film 2. The thickness of the gate insulator film 4 is set to 8 nm.

Next, polycide wiring 5 is formed to become the gate electrode of a MOS transistor. Further, a protective insulator film 6 adheres on the polycide wiring 5 to be deposited. An anti-reflection film pattern 7 is formed on the surface of the protective insulator film 6. The anti-reflection film pattern 7 is formed in an amorphous silicon film.

The anti-reflection film pattern 7 and the protective insulator film 6 are formed through the process of dry etching with using a photo resist mask built up by means of photo lithography as a mask for etching. Moreover, the photo resist mask is removed to form a polycide wiring 5 in patterns by dry etching with the antireflection film pattern 7 and the protective insulator film 6 as masks. As a result, gate electrode patterns 5' shown in FIG. 2A are formed.

As shown in FIG. 2A, the furrowings of wiring patterns, which are described in "Description of the Related Art", are not given to the gate electrode patterns 5' of the present invention, and as a result, precise and elaborate wiring is built up.

Figure 3A:
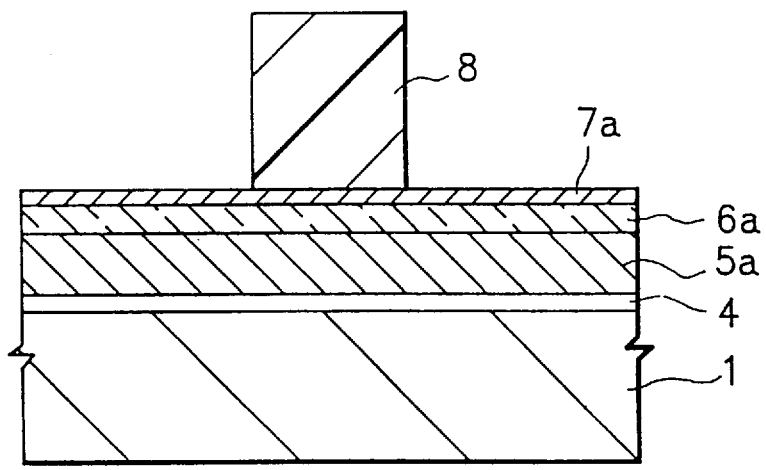
FIGS. 3A, 3B, 3C are cross section diagrams in order of manufacturing processes showing the first embodiment of the present invention.
Figure 3B:
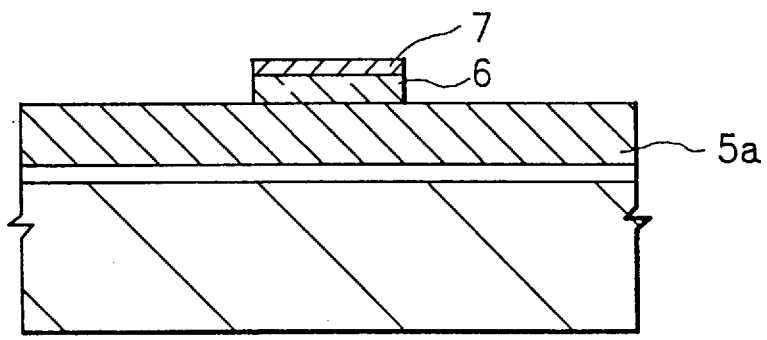
Figure 3C:
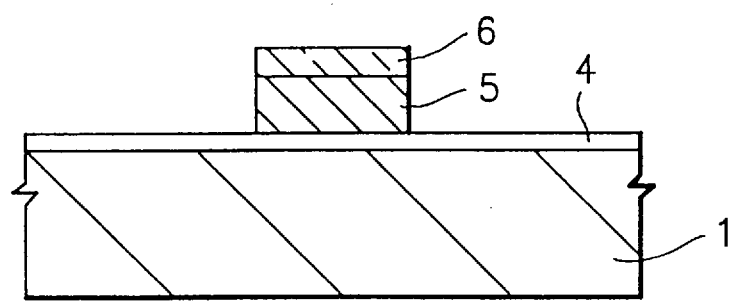

In the next place, the description of a fabricating method according to the present invention will be provided in accordance with FIGS. 3A, 3B, 3C. The FIGS. 3A, 3B, 3C are cross section diagrams showing processes from the formation of the photo resist mask by means of aforementioned photo lithography to the patterning of the gate electrode in order.

As shown in FIG. 3A, approximately 8 nm in thickness of the gate insulator film 4 is made up on the surface of the silicon substrate 1 by way of thermal oxidation. Next, the gate insulator film 4 is coated to build up a tungsten-polycide film layer 5a comprising approximately 100 nm in thickness of a polysilicon film layer that includes phosphorus impurities and approximately 150 nm in thickness of a tungsten-silicide film layer.

Subsequently, a silicon oxide film layer 6a is deposited on the surface of the tungsten-polycide film layer 5a by chemical vapor development (CVD) method. The silicon oxide film layer 6a is 100~200 nm in thickness. Further, a silicon film layer 7a is deposited on the silicon oxide film layer 6a by sputtering method. The silicon film layer 7a is set to approximately 50 nm in thickness.

Next, a photo resist pattern 8 is formed by way of photo etching which is a well-known photo lithography.

In the next step, the silicon film layer 7a and the silicon oxide film layer 6a are processed by etching in order with the photo resist pattern 8 as a mask for dry etching. Consequently, a protective insulator film 6 and an antireflection film pattern 7 shown in FIG. 3B are made up.

Next, the tungsten-polycide film layer 5a is processed by etching with the protective insulator film 6 as a mask for dry etching. In this manner, polycide wiring 5 is built up on the surface of the gate insulator film 4 on the silicon substrate 1 as shown in FIG. 3c. In the etching process of the tungsten-polycide film layer 5a, the antireflection film pattern 7 is also processed by etching and removed at the same time. This is because both of the tungsten-polycide film layer 5a and the antireflection film pattern 7 include a silicon atom and therefore, can be processed by etching with the same dry etching gas.

While, the antireflection film pattern may be made up of a titanium nitride layer, or a titanium-polycide may be used as the conductive material of the gate electrode. In this case, too, the antireflection film pattern can be removed at the same time as the formation of the gate electrode pattern.

Thus, the wiring of the gate electrode without the furrowings of wiring pattern is build up.

Figure 4:
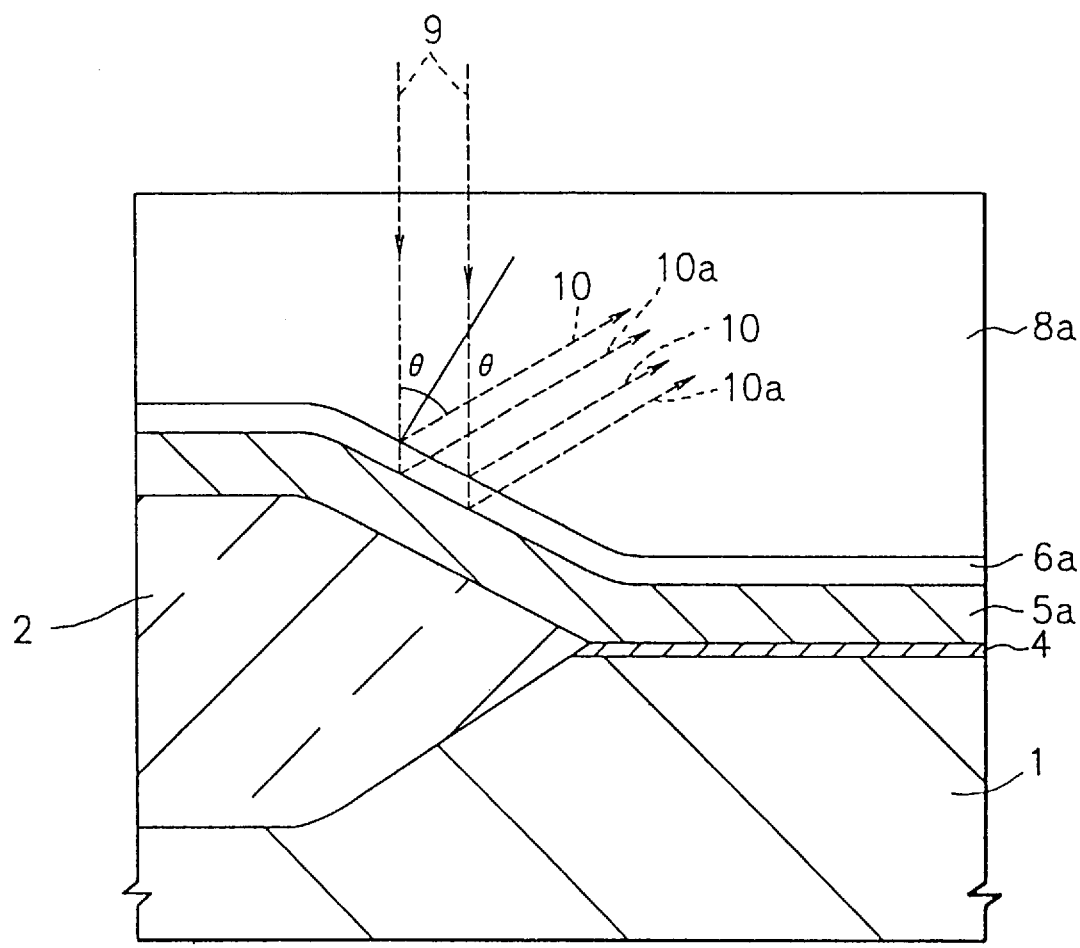
FIG. 4 is a light exposure diagram showing effect of the conventional wiring of FIGS. 1A and 1B.
Figure 5:
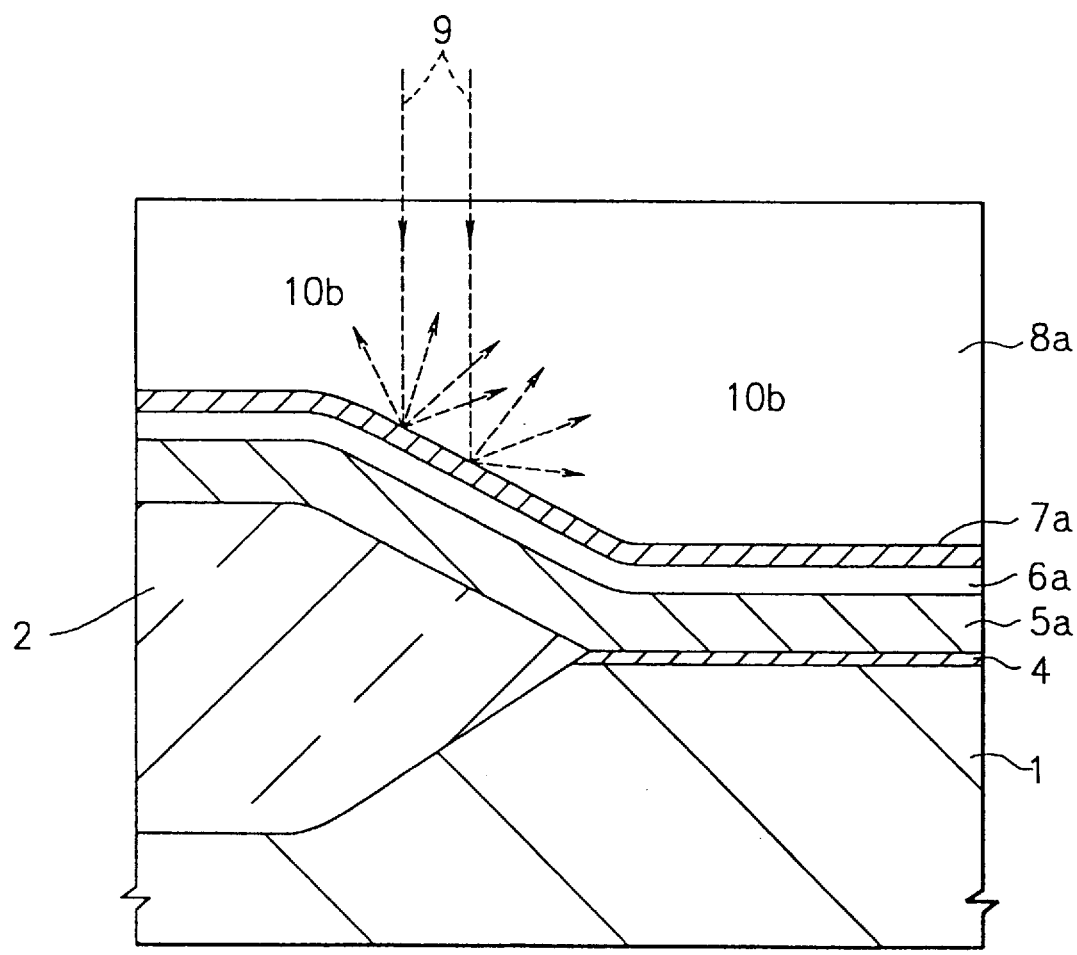
FIG. 5 is another light exposure diagram showing effect of the first embodiment of the present invention.

In the next step, the effect of the present invention and a mechanism which provide the effect will be explained in accordance with FIGS. 4, 5. FIGS. 4, 5 show the state of light exposure in the photo lithography process for wiring formation in diagrams. Each of FIG. 4 and FIG. 5 shows an irradiated object to be exposed in a diagram according to the "Description of the Related Art" and present invention respectively. Namely, as shown in FIGS. 4, 5, the field oxide film 2 is selectively made up on the surface of the silicon substrate, and the tungsten-polycide film layer 5a which is a conductive material with high reflectance is made up on the silicon substrate through the gate insulator film 4, so that the silicon oxide film layer 6a coating whole layers is formed, and a photo resist film 8a is made up with coating. The other transparent insulator film such as a silicon nitride film may be used instead of the silicon oxide film layer.

As shown in FIG. 4, when such an irradiated object to be exposed as mentioned in the Related Art is given an irradiation light for sensitizing 9 through the optical pattern of the gate electrode, a part of the irradiation light for sensitizing 9 penetrates the silicon oxide film layer 6a, and reflects on the surface of the tungsten-polycide film layer 5a to produce a reflected light 10a. And the other part reflects on an interface between the silicon oxide film layer 6a and photo resist film 8a to produce a reflected light 10. The phase of the reflected light 10 dose not shift because refractive index of the photo resist film 8a is approximately 1.7 and that of the silicon oxide film is approximately 1.45. While, there shifts by approximately 180° the phase of the reflected light 10a which is produced as a result that the irradiation light 9 for sensitizing penetrates the silicon oxide film layer 6a and reflects on the surface of the tungsten-polycide film layer 5a.

Hence, provided that 'd' represents the thickness of the silicon oxide film layer 6a, 'n' represents refractive index, 'λ' represents the wave length of the irradiation light for sensitizing 9, and 'θ' is the angle of reflection and 'm' is positive odd number, and when the silicon oxide film layer 6a meets formula (1), the anti-reflection 10, 10a intensify with each other by interference, so that a reflection luminous intensity extremely increases.

$$d = m\lambda \cos \theta / 4n \tag{1}$$

For example, such a case as described above happens when the tilt angle of the surface of the field oxide film 2 is 20°, namely the angle of θ of FIG. 4 is approximately 20°. When the irradiation light for sensitizing 9 is represented by a line i and its wave length is 365 nm, reflective luminous intensity of the irradiation light for sensitizing 9 attains a maximum at a thickness of 60 nm or 180 nm of the silicon oxide film layer 6a. Depending on aforementioned tilt angle of the foundation, such increase of the reflective luminous intensity is seen in an area where the formula (1) is met. In the area where the reflection luminous intensity increases by the interference, excessive exposure is given to the photo resist film 8a to produce aforementioned furrowings of the wiring pattern.

While, as shown in FIG. 5, when such an antireflection film as a silicon film layer 7a is formed, the irradiation light for sensitizing 9 is isotropicly scattered by the antireflection film, and becomes a reflection light 10b by irregular reflection. One direction reflection luminous intensity sharply decreases, and aforementioned increase of the reflective luminous intensity by the interference of two reflection lights is restrained. Or, such an antireflection film as a titanium nitride layer which entirely absorbs the irradiation light for sensitizing does not cause the component of the reflection light to be produced at all.

Thus, such a structure shown in FIG. 5 prevents the reflection luminous intensity by the interference from increasing in a whole area within a semiconductor apparatus and producing the furrowings of the wiring pattern.

Consideration of the structure leading such an effect, leads to an effective way to form the antireflection film in accumulation on the conductive material that is to be wiring, and make up the silicon oxide film layer on the antireflection film. In this case, however, it is impossible to remove aforementioned antireflection film pattern by etching simultaneously with the formation of wiring, so that a manufacturing process become complicated.

Figure 6A:
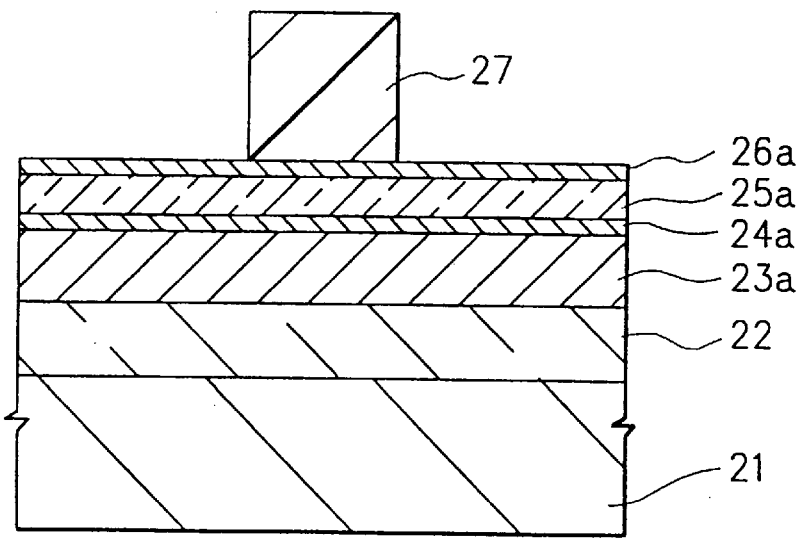
FIGS. 6A, 6B, 6C are cross section diagrams in order of manufacturing processes showing a second embodiment of the present invention.
Figure 6B:
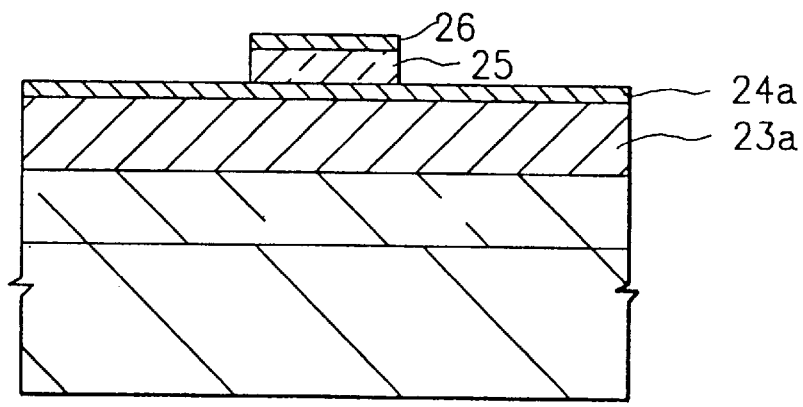
Figure 6C:
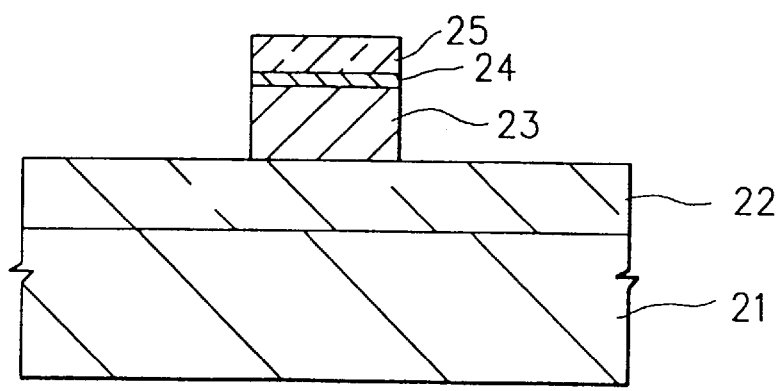

In the next step, the second embodiment of the present invention will be described in accordance with FIGS. 6A, 6B, 6C. FIGS. 6A, 6B, 6C are cross section diagrams showing the order of a manufacturing process where the elaborate wiring of aluminum is built up on the insulator film 22 between layers. As shown in FIG. 6A, the insulator film 22 between layers is made up of a silicon oxide film deposited by CVD method on the surface of a silicon substrate 21. The thickness of the insulator film 22 between layers is set to approximately 500 nm. Next, an alloy thin film 23a which is the alloy of aluminum and copper is deposited by a sputtering method. The thickness of the alloy thin film 23a is approximately 500 nm. Subsequently, the first titanium nitride film layer 24a is deposited to be made up on the alloy thin film 23a. The thickness of the first titanium nitride film layer 24a is approximately 150 nm.

After that, a silicon oxide film layer 25a is deposited by the CVD method. The thickness of the silicon oxide film layer 25a is set to approximately 200 nm. Subsequently, a second titanium nitride film layer 26a is piled up on the silicon oxide film layer 25a by the sputtering method. The thickness of the second titanium nitride film layer 26a is set to approximately 50 nm.

In the next step, a photo resist pattern 27 is formed by way of photo etching with the well-known photo lithography.

Next, the second titanium nitride film layer 26a and the silicon oxide film layer 25a are processed by etching in order with the photo resist pattern 27 as a mask for dry etching. Consequently, a protective insulator film 25 and an antireflection film pattern 26 shown in FIG. 6B are made up.

In the next step, the alloy thin film 23a of an aluminum and a copper and the first titanium nitride film layer 24a are processed by etching with the protective insulator film 25 as a mask for dry etching. In this manner, the elaborate wiring where the aluminum alloy wiring 23 and the titanium nitride wiring 24 are deposited is formed on the surface of the insulator film 22 between layers on the silicon substrate 21 as shown in FIG. 6c. In this case, with the etching of the titanium nitride film layer 24a, aforementioned antireflection film pattern 26 is also processed by etching to be removed at the same time.

Thus, the deposited wiring including an aluminum alloy without the furrowing is build up.

The above embodiment, describes a case in which a protective insulator film is made up of a silicon oxide film. In addition, it should be noted that a silicon nitride film or the compound insulator film of a silicon oxide film and a silicon nitride film has the similar effect as a protective insulator film.

As described above, according to the present invention, an antireflection film is made up on a protective insulator film that is used as a mask for a wiring pattern. Therefore, aforementioned furrowings of a wiring pattern in the area including a difference part of foundation is not formed at all. Moreover, the antireflection film is processed by etching to be removed at the same time with the etching process for the formation of wiring, which has no negative influence upon subsequent manufacturing processes. For example, the processes for the formation of wiring does not increase.

Thus, owing to the present invention, an electrical characteristic of the MOS transistor with an elaborate gate electrode is stabilized, and its variation is extremely reduced, so that a cell operating characteristic of an elaborate and dense SRAM or an operating characteristic of a sense amplifier is greatly improved.

Besides, the reliability of a forming process of an elaborate multilevel interconnection is advantageously developed, and as a result, the recovery of a semiconductor apparatus including these multilevel interconnection is exceedingly improved.

While preferred embodiments of the invention have been described using specific terms, such description is for illustrative purposes only, and it is to be understood that changes and variations may be made without departing from the spirit or scope of the following claims.

What is claimed is:

1. A method of manufacturing a wiring layer in a semiconductor device comprising the steps of:

forming a conductive material film comprised of an alloy on the surface of an insulator film on a semiconductor substrate;

depositing an inorganic film, which comprises one of a semiconductor oxide film and a semiconductor nitride film, on said conductive material film;

forming an antireflection film to an irradiation light for a sensitizing on said inorganic insulator film used in photo lithography which patterns photosensitivity resist film;

forming said photosensitivity resist film on said antireflection film to pattern in a wiring shape;

applying dry etching to said antireflection film and said inorganic insulator film with said patterned photosensitivity resist film as a mask;

removing said patterned photosensitivity resist film as a mask; and applying dry etching to said antireflection film for removing thereof and simultaneously to said conductive material film with said inorganic insulator film as a mask.

2. A method of manufacturing a wiring layer in a semiconductor device according to claim 1, wherein said antireflection film is made up of an amorphous silicon film.

* * * * *